United States Patent
Chang

(10) Patent No.: US 9,276,597 B1
(45) Date of Patent: Mar. 1, 2016

(54) CIRCUIT AND METHOD FOR CALIBRATION OF ANALOG-TO-DIGITAL CONVERTER

(71) Applicant: MediaTek Inc., Hsin-Chu (TW)

(72) Inventor: Wen-Hua Chang, Tainan (TW)

(73) Assignee: MEDIATEK INC., Hsin-Chu (TW)

(*) Notice: Subject to any disclaimer, the term of this patent is extended or adjusted under 35 U.S.C. 154(b) by 0 days.

(21) Appl. No.: 14/618,263

(22) Filed: Feb. 10, 2015

(51) Int. Cl.
H03M 1/06 (2006.01)
H03M 1/10 (2006.01)
H03M 1/36 (2006.01)

(52) U.S. Cl.
CPC ............ *H03M 1/1023* (2013.01); *H03M 1/361* (2013.01)

(58) Field of Classification Search
CPC ......... H03M 1/009; H03M 1/00; H03M 1/46; H03M 2201/63; H03M 1/1023; H03M 1/361; G06F 7/26
USPC .......... 341/118, 120, 155, 144, 161, 159, 172
See application file for complete search history.

(56) References Cited

U.S. PATENT DOCUMENTS

| | | | | |
|---|---|---|---|---|
| 6,707,413 B2 * | 3/2004 | Sushihara | ............. | H03M 1/204 341/159 |
| 7,884,748 B2 * | 2/2011 | Delagnes | ............. | G06F 10/005 341/156 |
| 8,130,131 B2 * | 3/2012 | Nakajima | ............. | H03M 1/002 341/155 |
| 8,183,903 B2 * | 5/2012 | Glass | ............. | H03M 1/204 327/231 |
| 8,253,470 B2 * | 8/2012 | Mulder | ............. | H03F 3/45192 327/306 |

* cited by examiner

*Primary Examiner* — Peguy Jean Pierre
(74) *Attorney, Agent, or Firm* — McClure, Qualey & Rodack, LLP

(57) ABSTRACT

An analog-to-digital converter is provided. Each pre-amplifier provides a pair of differential outputs according to a pair of differential analog input signals and a first reference voltage and a second reference voltage from a resistor chain, wherein the first reference voltage is different from the second reference voltage. Each dynamic comparator provides a first comparing signal and a second comparing signal according to the pair of differential outputs of the pre-amplifier. Each pre-amplifier includes a first calibration unit for calibrating a first offset voltage from the pre-amplifier at the pair of differential outputs at a specific temperature, and a second calibration unit for calibrating a second offset voltage from the corresponding dynamic comparator at the pair of differential outputs.

16 Claims, 7 Drawing Sheets

US 9,276,597 B1

CIRCUIT AND METHOD FOR CALIBRATION OF ANALOG-TO-DIGITAL CONVERTER

BACKGROUND OF THE INVENTION

1. Field of the Invention

The invention relates to flash analog-to-digital converters (ADCs), and more particularly to offset calibration of flash analog-to-digital converters.

2. Description of the Related Art

Currently, analog-to-digital converters (ADCs) are widely used in a variety of applications, such as medical systems, audio systems, test and measurement equipment, communication systems, and image and video systems. The most common ADC construction comprises flash ADCs, pipeline ADCs and successive approximation register (SAR) ADCs, wherein the flash ADCs and the pipeline ADCs are faster than the SAR ADCs.

High-speed low-resolution flash ADCs are widely used in current circuit systems, such as these for disk drive read channels, DVD playback, and communication receiver systems. In general, an ADC converts a continuous quantity (e.g., voltage) into a digital representation (e.g., binary code that represents the voltage). Theoretically, an ideal ADC has a one-to-one mapping, also known as its transfer function. For example, an ideal ADC converts a unique voltage value into a unique digital code. Non-idealities can arise from environmental changes, such as changes in power supply voltage or operating temperature, or operational changes, such as changes in input signal voltages, converter resolutions or offset error.

An ADC may comprise multiple comparators for conversion of the analog data into digital data. In order to accurately convert the analog data, it is desirable that the comparators exhibit very little electrical variation from ideal operation even in the presence of "offsets". Many sources exist for offsets including mismatch between two devices (for example transistors, resistors, capacitors, etc.) which, though it is intended that they be identical, vary to one degree or another due to limitations in the fabrication processes.

Therefore, offset calibration with temperature resistance in a flash ADC is desired.

BRIEF SUMMARY OF THE INVENTION

A circuit and a method for calibration of an analog-to-digital converter are provided. An embodiment of an ADC is provided. The ADC comprises a plurality of resistors forming a resistor chain, a plurality of pre-amplifiers, and a plurality of dynamic comparators coupled to the pre-amplifiers. Each pre-amplifier provides a pair of differential outputs according to a pair of differential analog input signals, a first reference voltage, and a second reference voltage from the resistor chain, wherein the first reference voltage is different from the second reference voltage. Each dynamic comparator provides a first comparing signal and a second comparing signal according to the pair of differential outputs of the corresponding pre-amplifier. Each of the pre-amplifiers comprises: a first calibration unit, for calibrating a first offset voltage from the pre-amplifier at the pair of differential outputs at a specific temperature; and a second calibration unit, for calibrating a second offset voltage from the corresponding dynamic comparator at the pair of differential outputs.

Furthermore, an embodiment of a calibration method for calibrating offset of an analog-to-digital converter is provided. The analog-to-digital converter comprises at least one pre-amplifier and at least one dynamic comparator, wherein the pre-amplifier provides a pair of differential outputs according to a pair of differential analog input signals and a first reference voltage and a second reference voltage, and the dynamic comparator provides a first comparing signal and a second comparing signal according to the pair of differential outputs. A first offset voltage from the pre-amplifier is calibrated at the pair of differential outputs, by a first calibration unit of the pre-amplifier at a specific temperature. A second offset voltage from the dynamic comparator is calibrated at the pair of differential outputs, by a second calibration unit of the pre-amplifier.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
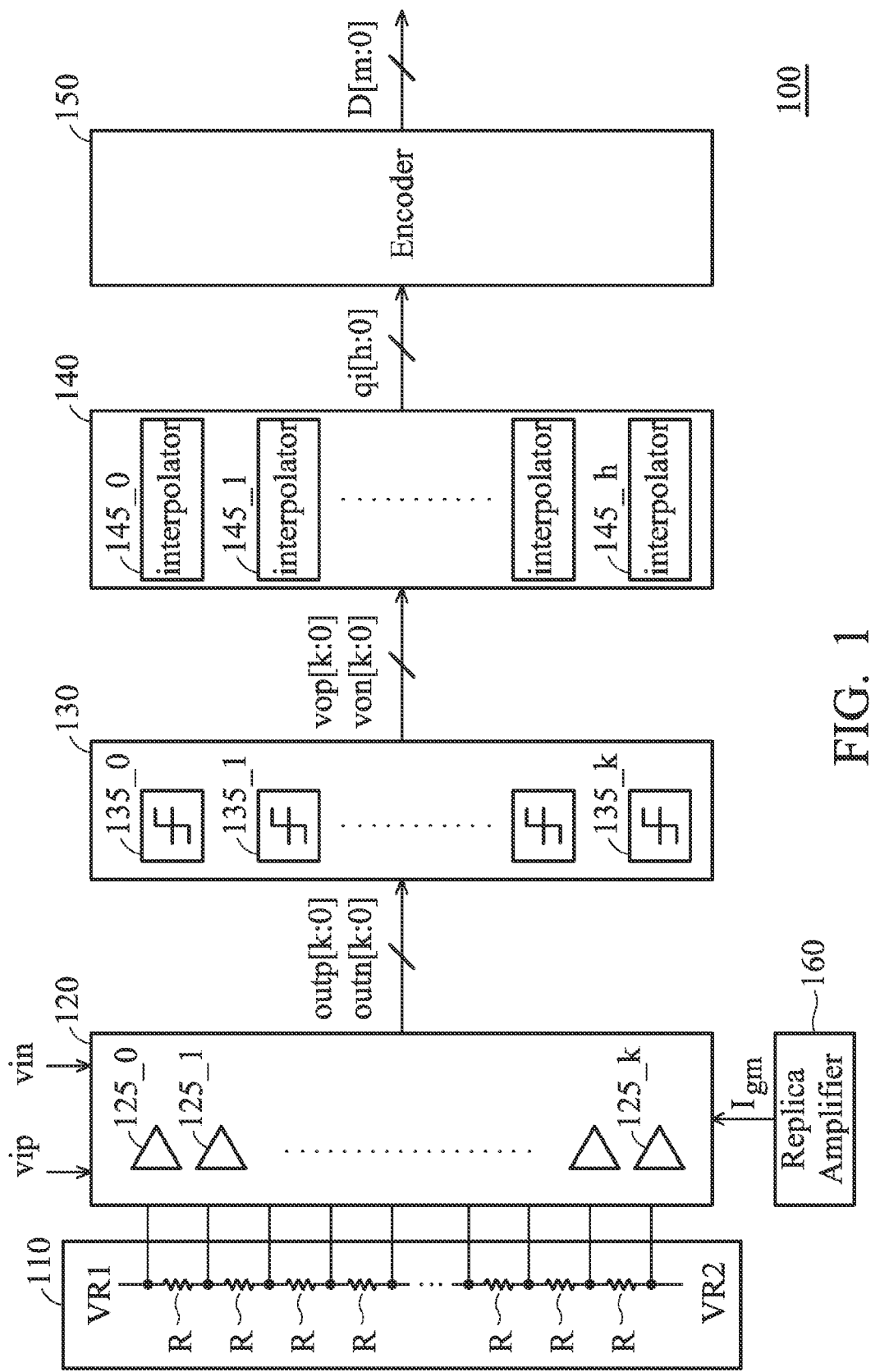
FIG. 1 shows an analog-to-digital converter (ADC) according to an embodiment of the invention.

FIG. 1 shows an analog-to-digital converter (ADC) 100 according to an embodiment of the invention. The ADC 100 comprises a resistor chain 110, an amplifier circuit 120, a comparator circuit 130, an interpolator circuit 140, an encoder 150, and a replica amplifier 160. In the embodiment, the ADC 100 is capable of converting a pair of differential analog input signals vip/vin into an n-bit digital signal D. The resistor chain 110 is formed by a plurality of resistors R. The resistors R are coupled in series between the voltages VR1 and VR2, wherein the resistor chain 110 is capable of providing different divided voltages between the voltages VR1 and VR2 to the amplifier circuit 120. Furthermore, the amplifier circuit 120 amplifies the pair of differential analog input signals vip/vin to provide a plurality of pairs of differential outputs outp[k:0]/outn[k:0] according to the divided voltages from the resistor chain 110, wherein the amplifier circuit 120 comprises a plurality of pre-amplifiers 125_0-125-$k$. For example, the pre-amplifier 125_0 provides the pairs of differential outputs outp[0]/outn[0] according to the corresponding divided voltages and the pair of differential analog input signals vip/vin. Furthermore, the comparator circuit 130 comprises a plurality of dynamic comparators 135_0-135-$k$.

Each of the dynamic comparators 135_0-135-k is coupled to the corresponding pre-amplifier, and compares the pairs of differential outputs of the corresponding pre-amplifier to provide a pair of comparing signals. For example, the dynamic comparator 135_0 is coupled to pre-amplifier 125_0, and the dynamic comparator 135_0 compares the pairs of differential outputs outp[0]/outn[0] of the pre-amplifier 125_0, to provide a pair of comparing signals vop[0]/von[0]. Moreover, the interpolator circuit 140 comprises a plurality of interpolators 145_0-145_h. Each interpolator 145_0-145_h is coupled to the two corresponding dynamic comparators, and generates an interpolating signal according to the comparing signals of the two corresponding dynamic comparators. For example, the interpolator 145_0 provides an interpolating signal qi[0] according to the pairs of comparing signals vop[0]/von[0] of the dynamic comparator 135_0 and the pairs of comparing signals vop[1]/von[1] of the dynamic comparator 135_1. Next, the encoder 150 provides a digital output D[m:0] according to the interpolating signals qi[h:0], wherein m=n−1. In the embodiment, the replica amplifier 160 is capable of providing a compensation current $I_{gm}$ to the pre-amplifiers 125_0-125-k of the amplifier circuit 120, so as to calibrate offset voltages at the pairs of differential outputs outp[k:0]/outn[k:0], wherein the replica amplifier 160 generates the compensation current $I_{gm}$ with a specific temperature resistance (i.e. at a specific temperature).

Figure 2:
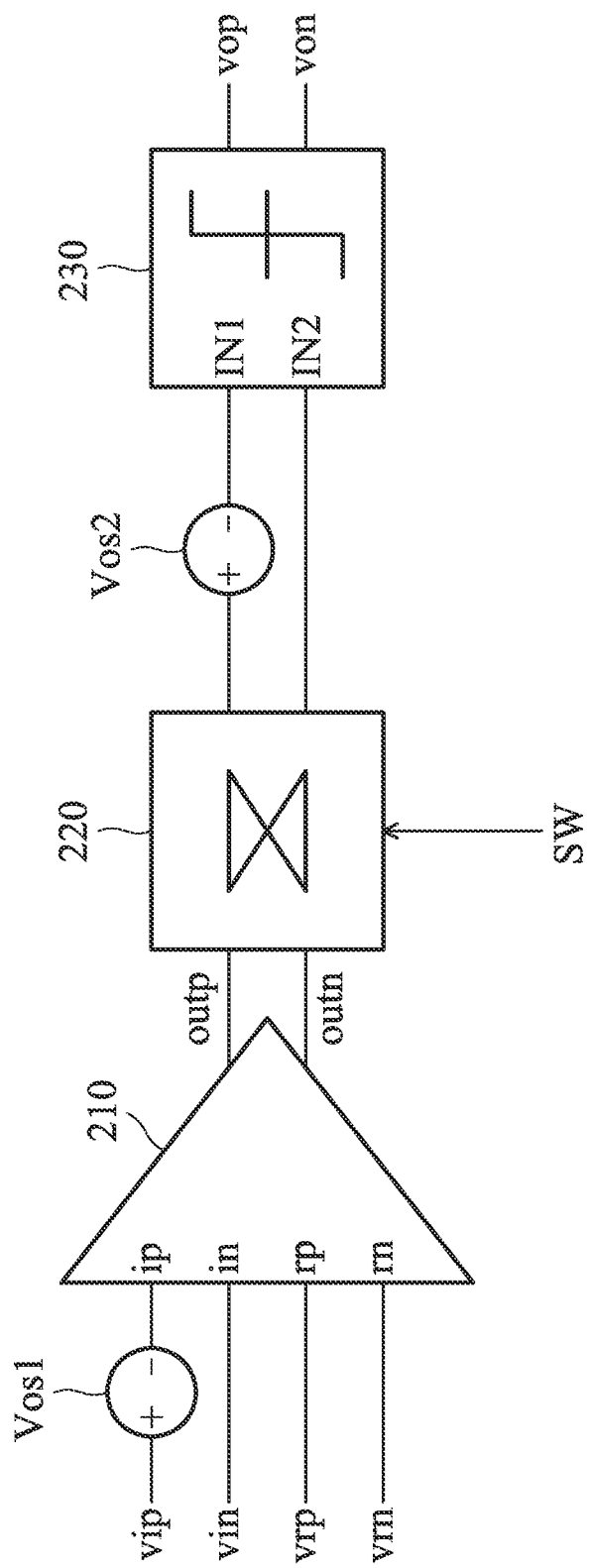
FIG. 2 is a schematic illustrating a connection between a pre-amplifier and a dynamic comparator in an analog-to-digital converter (ADC), according to an embodiment of the invention.

FIG. 2 shows a schematic illustrating a connection between a pre-amplifier 210 and a dynamic comparator 230 of an analog-to-digital converter (ADC) according to an embodiment of the invention. In the embodiment, the pre-amplifier 210 may be one of the pre-amplifiers 125_0-125-k of FIG. 1, and the dynamic comparator 230 may be the dynamic comparator corresponding to the one of the pre-amplifiers 125_0-125-k of FIG. 1. In FIG. 2, the pre-amplifier 210 receives a pair of differential analog signals vip/vin via the input terminals ip and in and receives the pair of reference voltages vrp/vrn from a resistor chain (e.g. 110 of FIG. 1) via the input terminals rp and rn, so as to provide a pair of differential outputs outp/outn. It should be noted that the reference voltage vrp is different from the reference voltage vrn. Furthermore, a swapping unit 220 is disposed between the pre-amplifier 210 and the dynamic comparator 230, and is capable of swapping the pair of differential outputs outp/outn according to a switch signal SW. For example, if the swapping unit 220 is disabled by the switch signal SW (e.g. in a normal mode), the differential output outp is transmitted to an input terminal IN1 of the dynamic comparator 230, and the differential output outn is transmitted to an input terminal IN2 of the dynamic comparator 230. Conversely, if the swapping unit 220 is enabled by the switch signal SW (e.g. in a swap mode), the differential output outp is transmitted to the input terminal IN2 of the dynamic comparator 230, and the differential output outn is transmitted to the input terminal IN1 of the dynamic comparator 230, i.e. the pair of differential outputs outp/outn to be transmitted to the dynamic comparator 230 are swapped. When receiving the pair of differential outputs outp/outn, the dynamic comparator 230 compares the pairs of differential outputs outp/outn to provide a pair of comparing signals vop/von. In general, transistor mismatch on analog circuits will cause offset error. Therefore, an offset voltage Vos1 may be caused by threshold voltage mismatch of input differential pair transistors in the pre-amplifier 210, and an offset voltage Vos2 may be caused by threshold voltage mismatch of input differential pair transistors in the dynamic comparator 230. Assuming that a gain of the pre-amplifier 210 is "A", the total input offset voltage at the pre-amplifier 210 would be equal to Vos1+Vos2/A, wherein the gain A is obtained according to a transconductance gm and an impedance RI (i.e. A=gm×RI), where the transconductance gm has large temperature coefficient. In order to optimize the linearity of the ADC, the pre-amplifier 210 needs to calibrate the offset voltages Vos1 and Vos2.

Figure 3:
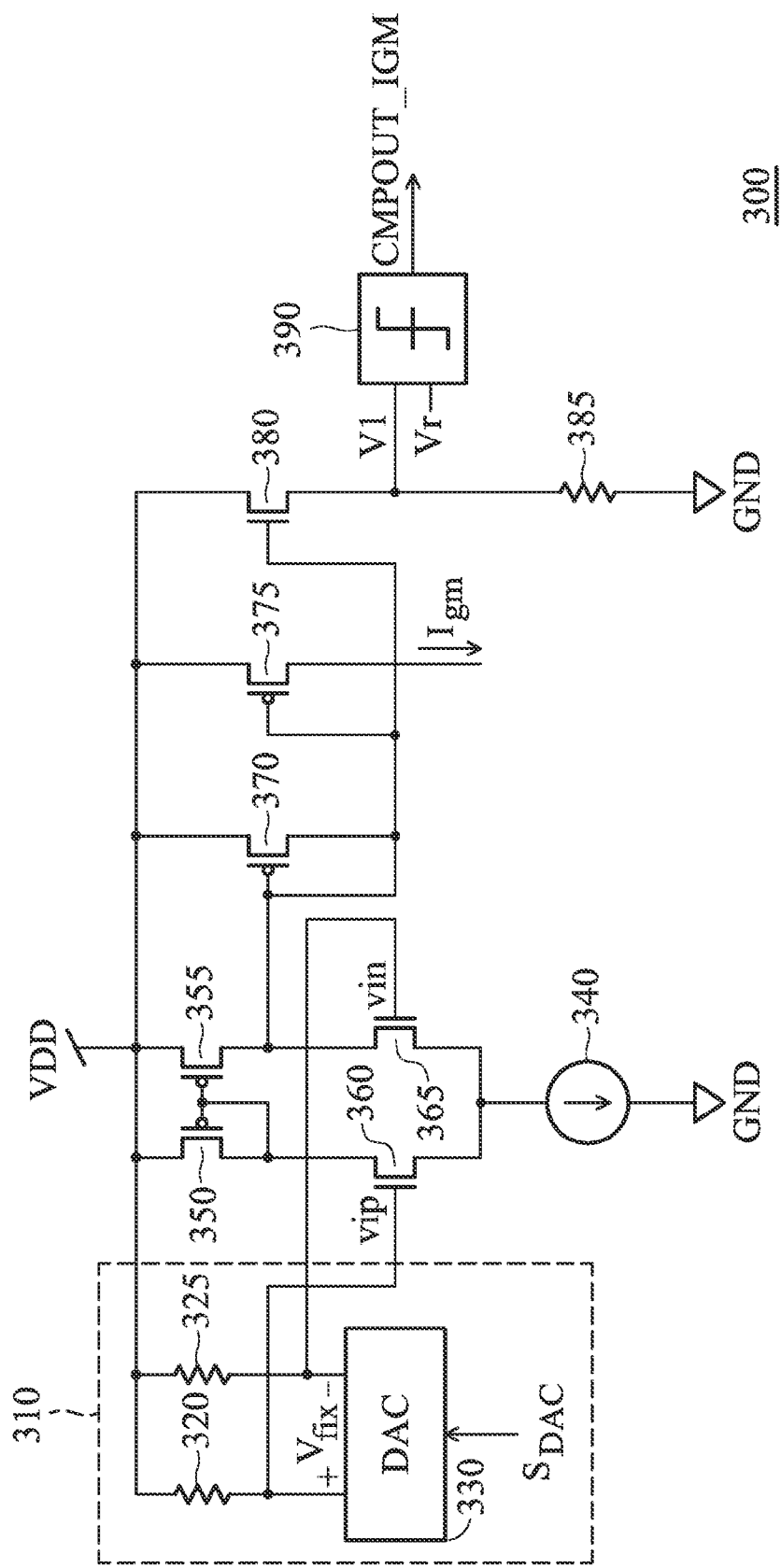
FIG. 3 shows a replica amplifier according to an embodiment of the invention.

FIG. 3 shows a replica amplifier 300 according to an embodiment of the invention. The replica amplifier 300 comprises a voltage generator 310, a current source 340, the PMOS transistors 350, 355, 370, 375 and 380, the NMOS transistors 360 and 365, a resistor 385 and a comparator 390. The voltage generator 310 is capable of providing a fixed bias voltage $V_{fix}$ between the pair of differential analog signals vip/vin. The voltage generator 310 comprises the resistors 320 and 325, and a digital-to-analog converter (DAC) 330. The resistor 320 is coupled between a power VDD and a gate of the NMOS transistor 360, and the resistor 325 is coupled between the power VDD and a gate of the NMOS transistor 365. The DAC 330 is coupled to the resistors 320 and 325, wherein the DAC 330 provides the fixed bias voltage $V_{fix}$ according a control signal $S_{DAC}$ and applies the fixed bias voltage $V_{fix}$ to the gates of the NMOS transistors 360 and 365, wherein the control signal $S_{DAC}$ is provided by a processor (not shown). The PMOS transistor 350 is coupled between the power VDD and the NMOS transistor 360, and the NMOS transistor 360 is coupled between the PMOS transistor 350 and the current source 340. The PMOS transistor 355 is coupled between the power VDD and the NMOS transistor 365, and the NMOS transistor 365 is coupled between the PMOS transistor 355 and the current source 340. Furthermore, the differential analog signal vip is applied to the gate of the NMOS transistor 360, and the differential analog signal yin is applied to the gate of the NMOS transistor 365. The PMOS transistor 370 is coupled between the power VDD and the NMOS transistor 365, and the gate and the drain of the PMOS transistor 370 are coupled together. The PMOS transistor 375 has a gate coupled to the gate of the PMOS transistor 370, wherein the PMOS transistor 375 is capable of providing the compensation current $I_{gm}$. Furthermore, the PMOS transistor 380 is coupled between the power VDD and the resistor 385, and the resistor 385 is coupled between the PMOS transistor 380 and the ground GND. Moreover, the dynamic comparator 390 compares a voltage V1 at the resistor 385 and a reference voltage Vr to obtain a comparing signal CMPOUT_IGM. Thus, by adjusting the control signal $S_{DAC}$ to change the fixed bias voltage $V_{fix}$, the compensation current $I_{gm}$ and voltage V1 corresponding to the compensation current $I_{gm}$ are also changed, wherein the voltage V1 is obtained according to the compensation current $I_{gm}$ and a resistance R385 of the resistor 385, i.e. V1=$I_{gm}$×R385. In the embodiment, the processor will adjust the control signal $S_{DAC}$ to change the fixed bias voltage $V_{fix}$ until the comparing signal CMPOUT_IGM indicates that the voltage V1 is substantially equal to the reference voltage Vr at temperature T1, i.e. $I_{gm}$×R385=Vr.

Figure 4:
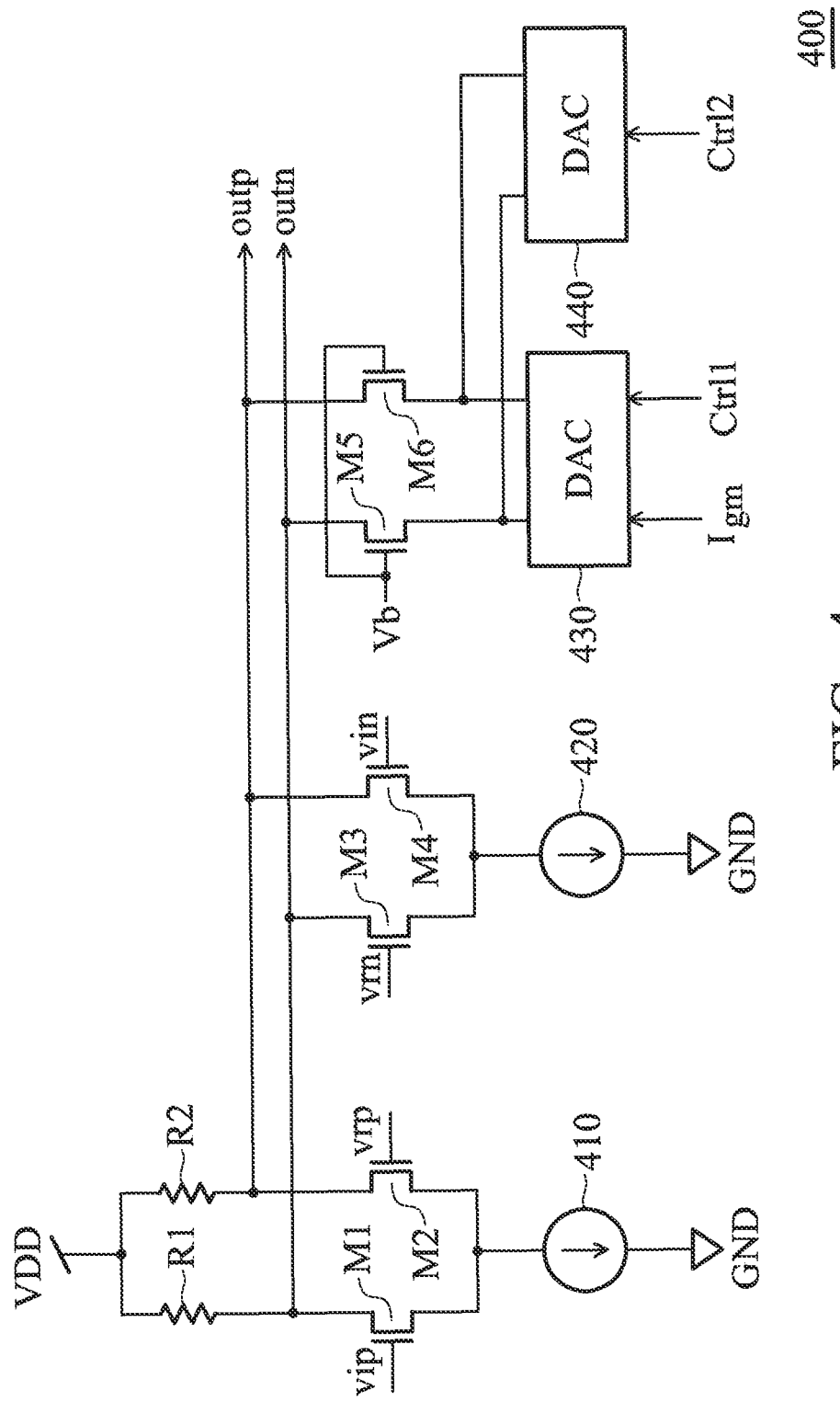
FIG. 4 shows a pre-amplifier 400 according to an embodiment of the invention.

FIG. 4 shows a pre-amplifier 400 according to an embodiment of the invention. The pre-amplifier 400 comprises the resistors R1 and R2, the NMOS transistors M1, M2, M3, M4, M5 and M6, the current sources 410 and 420, and the DACs 430 and 440. The resistor R1 is coupled between the power VDD and the NMOS transistor M1, and the resistor R2 is coupled between the power VDD and the NMOS transistor M2. The NMOS transistor M1 is coupled between the resistor R1 and the current source 410, and has a gate for receiving the differential analog input signal vip. The NMOS transistor M2 is coupled between the resistor R2 and the current source 410, and has a gate for receiving the reference voltage vrp. The NMOS transistor M4 is coupled between the resistor R2 and the current source 420, and has a gate for receiving the differential analog input signal yin. The NMOS transistor M3 is coupled between the resistor R1 and the current source 420, and has a gate for receiving the reference voltage vrn. In the pre-amplifier 400, the NMOS transistors M1 and M2 form a first differential input transistor pair, and the NMOS transistors M3 and M4 form a second differential input transistor pair. The NMOS transistor M5 is coupled to the resistor R1, and has a gate for receiving a bias voltage Vb. The NMOS transistor M6 is coupled to the resistor R2, and has a gate for receiving the bias voltage Vb. The NMOS transistors M5 and M6 form a differential bias transistor pair. The DAC 430 is coupled to the NMOS transistors M5 and M6, which is capable of controlling the currents flowing through the NMOS transistors M5 and M6 according to the compensation current $I_{gm}$ and the control signal Ctrl1. Moreover, the DAC 440 is also coupled to the NMOS transistors M5 and M6, which is capable of controlling the currents flowing through the NMOS transistors M5 and M6 according to the control signal Ctrl2. In the embodiment, the NMOS transistors M5 and M6 and the DAC 430 may form a first calibration unit, wherein the first calibration unit is capable of calibrating a offset voltage Vos1 (e.g. Vos1 of FIG. 2) according to a control signal Ctrl1 and the compensation current $I_{gm}$ for a replica amplifier (e.g. 300 of FIG. 3) at temperature T1. Furthermore, the NMOS transistors M5 and M6 and the DAC 440 may form a second calibration unit, wherein the second calibration unit is capable of calibrating a offset voltage Vos2 (e.g. Vos2 of FIG. 2) according to a control signal Ctrl2.

Figure 5:
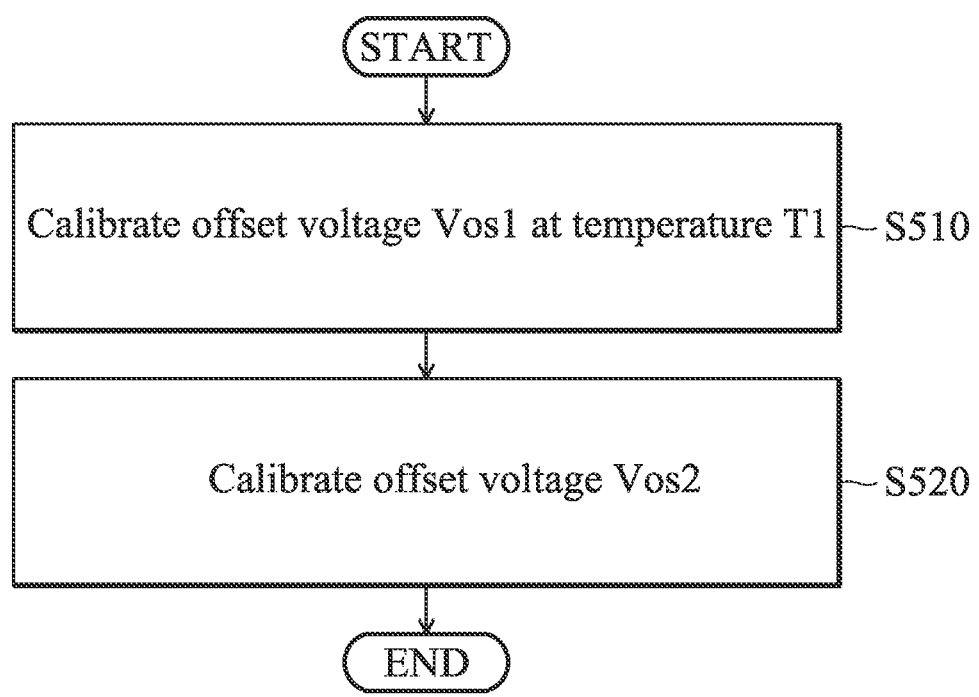
FIG. 5 shows a calibration method for calibrating offset at a pre-amplifier of an analog-to-digital converter (ADC) according to an embodiment of the invention.

FIG. 5 shows a calibration method for calibrating offset at a pre-amplifier (e.g. 400 of FIG. 4) of an analog-to-digital converter (ADC) according to an embodiment of the invention, wherein the analog-to-digital converter comprises at least the pre-amplifier and at least one dynamic comparator coupled to the pre-amplifier. First, in step S510, at a specific temperature T1, a first calibration unit of the pre-amplifier calibrates a first offset voltage Vos1 from the pre-amplifier at the pair of differential outputs of the pre-amplifier. Next, in step S520, a second calibration unit of the pre-amplifier calibrates a second offset voltage Vos2 from the dynamic comparator at the pair of differential outputs of the pre-amplifier. The detail of steps S510 and S520 will be described below. Furthermore, in one embodiment, a sequence of steps S510 and S520 can be swapped. Specifically, the offset voltage Vos1 and Vos2 can be calibrated separately and completely.

Figure 6:
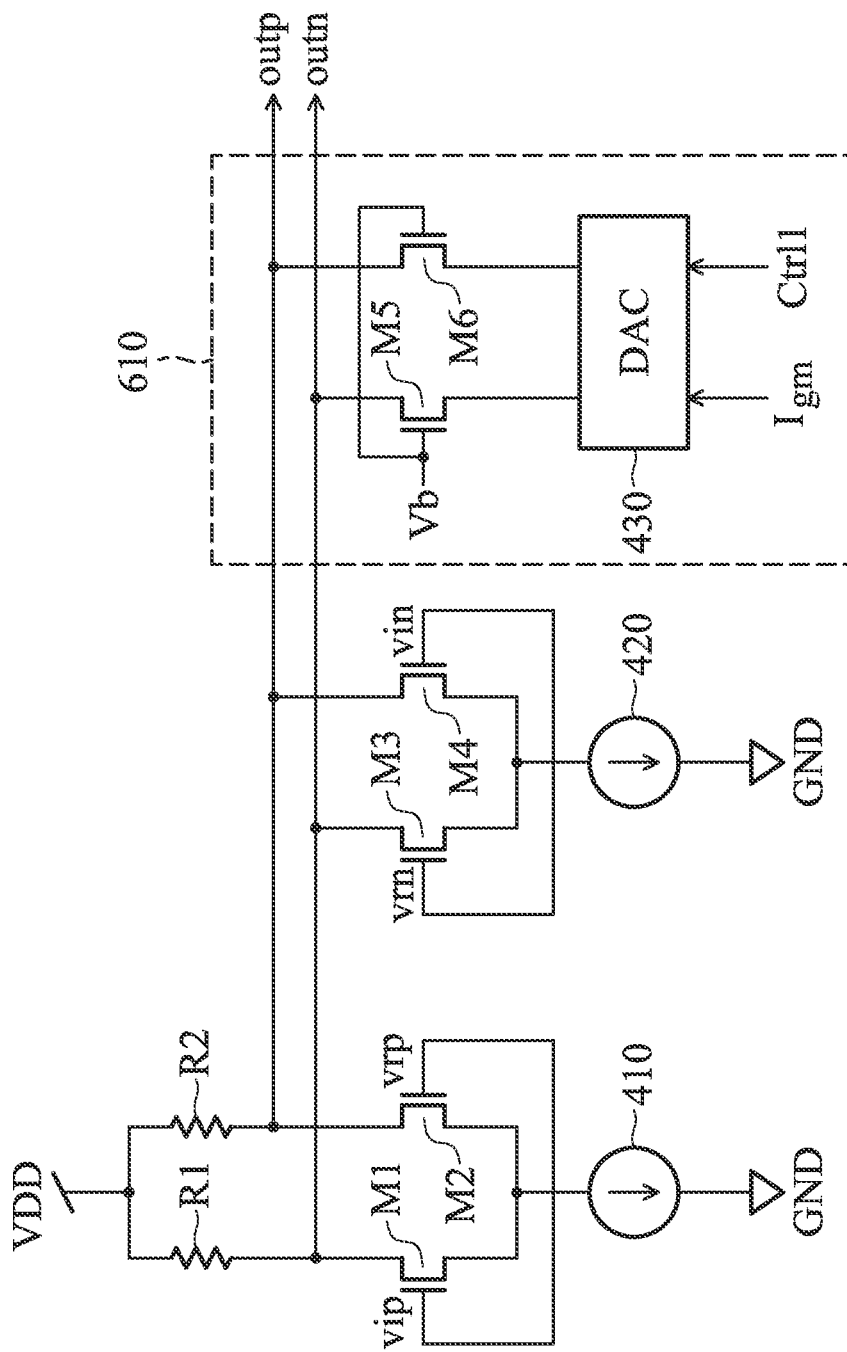
FIG. 6 shows a schematic illustrating calibration of the pre-amplifier of FIG. 3 according to step S510 of FIG. 5.

FIG. 6 shows a schematic illustrating calibration of the pre-amplifier of FIG. 3 according to step S510 of FIG. 5. As described above, a replica amplifier (e.g. 300 of FIG. 3) of the ADC will provide a compensation current $I_{gm}$ at temperature T1. Simultaneously, the gates of the NMOS transistors M1 and M2 are shorted together, i.e. it is set so that the differential analog input signal vip is equal to the reference voltage vrp. Moreover, the gates of the NMOS transistors M3 and M4 are also shorted together, i.e. it is set that the differential analog input signal yin is equal to the reference voltage vrn. In the embodiment, assuming a gain of the pre-amplifier is "A" (e.g. A=gm×RI), the offset voltage Vos1 will cause an amplified offset A_Vos1 (e.g. Vos1×gm×RI) at the outputs of the pre-amplifier. Therefore, by using the compensation current $I_{gm}$ at temperature T1, the amplified offset A_Vos1 can be calibrated. In the embodiment, a calibration unit 610 comprises the NMOS transistors M5 and M6 and the DAC 430. Furthermore, the compensation current $I_{gm}$ can be calculated as $I_{gm}=V_{fix}\times gm\_r$, where $V_{fix}$ represents the fixed bias voltage applied between the pair of differential analog signals vip/vin, and gm_r represents a transconductance of the replica amplifier. In FIG. 6, when the compensation current $I_{gm}$ is provided to the DAC 430, a processor (not shown) provides and adjusts the control signal Ctrl1 to the DAC 430, so as to obtain the control signal Ctrl1 with a digital value Code_DAC1 when the comparing signals vop/von of the dynamic comparator are changed (e.g. transition from high to low or transition from low to high) in response to the pair of differential outputs outp/outn. Thus, the amplified offset A_Vos1 is obtained according to the following equation (1):

$$A\_Vos1 = Vos1 \times gm \times RI \qquad (1)$$
$$= I_{gm} \times Code\_DAC1 \times RI.$$

Therefore, by removing the amplified offset A_Vos1 from the pair of differential outputs outp/outn, the offset voltage Vos1 can be calibrated by the calibration unit 610 according to the digital value Code_DAC1.

Figure 7:
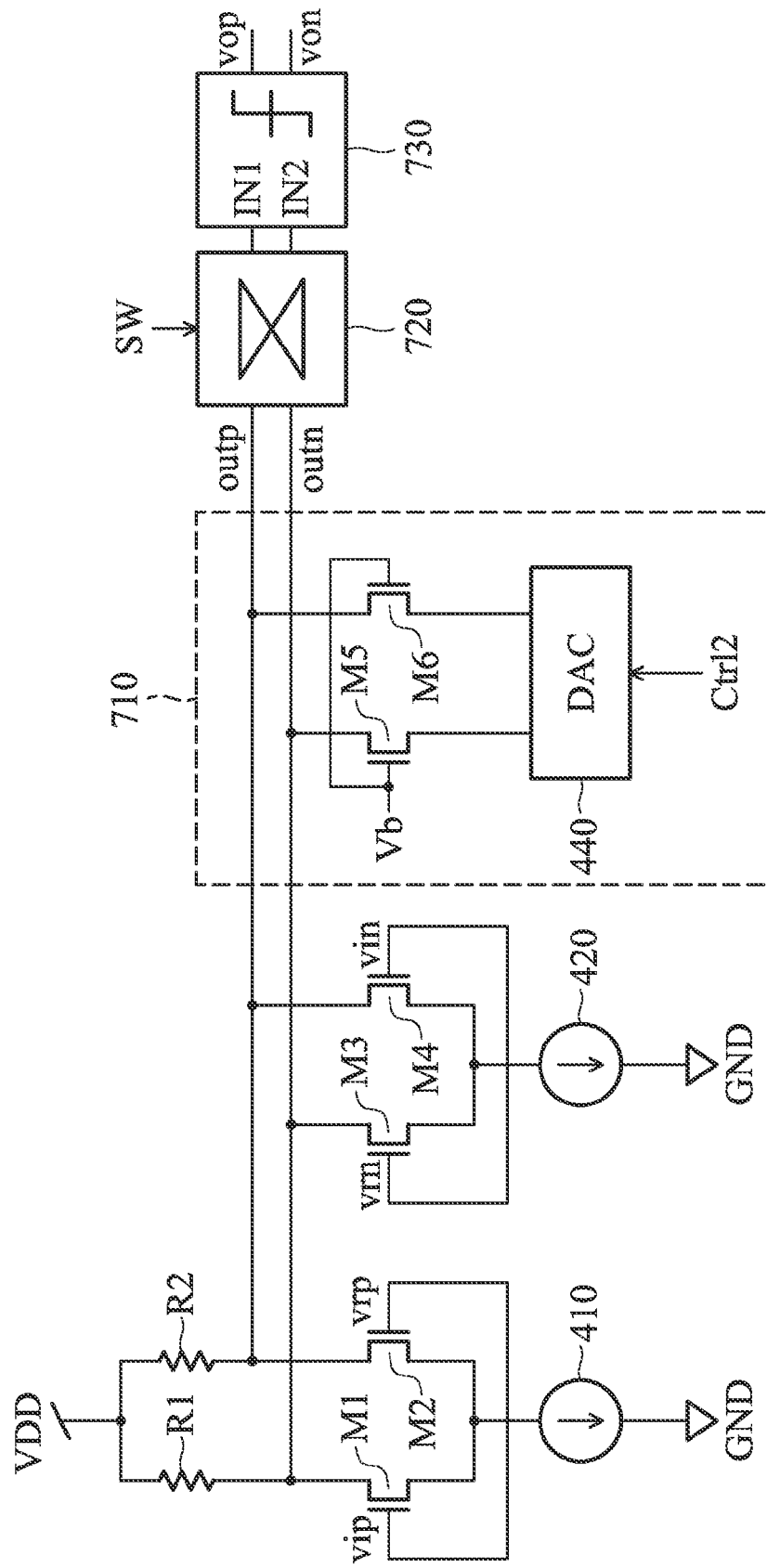
FIG. 7 shows a schematic illustrating calibration of the pre-amplifier of FIG. 3 according to step S520 of FIG. 5.

FIG. 7 shows a schematic illustrating calibration of the pre-amplifier of FIG. 3 according to step S520 of FIG. 5. First, the gates of the NMOS transistors M1 and M2 are shorted together, i.e. it is set so that the differential analog input signal vip is equal to the reference voltage vrp. Moreover, the gates of the NMOS transistors M3 and M4 are also shorted together, i.e. it is set that the differential analog input signal yin is equal to the reference voltage vrn. Simultaneously, the switch signal SW disables the swapping unit 720 (e.g. in a normal mode), so that the differential output outp is transmitted to an input terminal IN1 of the dynamic comparator 730, and the differential output outn is transmitted to an input terminal IN2 of the dynamic comparator 730. Next, a processor (not shown) provides and adjusts the control signal Ctrl2, so as to obtain the control signal Ctrl2 with a digital value Code_DAC2_N when the comparing signals vop/von of the dynamic comparator are changed in response to the pair of differential outputs outp/outn. Thus, the offset error at the pair of differential outputs outp/outn caused by the offset voltages Vos1 and Vos2 can be obtained according to the following equation (2):

$$Vos1 \times A + Vos2 = I \times Code\_DAC2\_N \times R \qquad (2).$$

Where I represents the less significant bit (LSB) unit current of DAC 440, and R represents the pre-amplifier output resistance. Next, the switch signal SW enables the swapping unit 720 (e.g. in a swap mode), so that the differential output outp is transmitted to the input terminal IN2 of the dynamic comparator 730, and the differential output outn is transmitted to the input terminal IN1 of the dynamic comparator 730. Next, the processor provides and adjusts the control signal Ctrl2 again, so as to obtain the control signal Ctrl2 with a digital value Code_DAC2_S when the comparing signals vop/von of the dynamic comparator are transited in response to the pair of differential outputs outp/outn. Thus, the offset error at the pair of differential outputs outp/outn caused by the offset voltages Vos1 and Vos2 can be obtained according to the following equation (3):

$$-Vos1 \times A + Vos2 = -I \times Code\_DAC2\_S \times R \qquad (3).$$

Next, according to equation (2) and equation (3), the offset voltage Vos2 is obtained according to the following equation (4):

$$Vos2 = \frac{R \times I \times (Code\_DAC2\_N - Code\_DAC2\_S)}{2}. \qquad (4)$$

Therefore, by removing the offset voltage Vos2 from the pair of differential outputs outp/outn, the offset voltage Vos2 can be calibrated by the calibration unit 710 according to the digital value Code_DAC2_N and the digital value Code_DAC2_S.

According to the embodiments, by using different calibration units, the offset voltages Vos1 and Vos2 can be calibrated separately and completely. Furthermore, the temperature resistance of the pre-amplifier is also being considered for offset calibration, thus increasing the linearity of the ADC.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An analog-to-digital converter, comprising:
   a plurality of resistors forming a resistor chain;
   a plurality of pre-amplifiers, each providing a pair of differential outputs according to a pair of differential analog input signals and a first reference voltage and a second reference voltage from the resistor chain, wherein the first reference voltage is different from the second reference voltage; and
   a plurality of dynamic comparators coupled to the pre-amplifiers, each providing a first comparing signal and a second comparing signal according to the pair of differential outputs of the corresponding pre-amplifier,
   wherein each of the pre-amplifiers comprises:
      a first calibration unit, for calibrating a first offset voltage from the pre-amplifier at the pair of differential outputs at a specific temperature; and
      a second calibration unit, for calibrating a second offset voltage from the corresponding dynamic comparator at the pair of differential outputs.

2. The analog-to-digital converter as claimed in claim 1, wherein the first offset voltage is caused by a first threshold voltage mismatch of input differential pair transistors in the pre-amplifier, and the second offset voltage is caused by a second threshold voltage mismatch of input differential pair transistors in the corresponding dynamic comparator.

3. The analog-to-digital converter as claimed in claim 1, further comprising:
   a plurality of switch units, each coupled between the corresponding pre-amplifier and the corresponding dynamic comparator, for swapping the pair of differential outputs according to a switch signal.

4. The analog-to-digital converter as claimed in claim 3, wherein the pre-amplifier further comprises:
   a first resistor coupled to a first node;
   a second resistor coupled to the first node;
   a first current source coupled to a second node;
   a first transistor coupled between the first resistor and the first current source, having a gate for receiving one signal among the pair of differential analog input signals;
   a second transistor coupled between the second resistor and the first current source, having a gate for receiving the first reference voltage;
   a second current source coupled to the second node;
   a third transistor coupled between the first resistor and the second current source, having a gate for receiving another signal among the pair of differential analog input signals; and
   a fourth transistor coupled between the second resistor and the second current source, having a gate for receiving the second reference voltage,
   wherein the first and second transistors form a first differential input transistor pair, and the third and fourth transistors form a second differential input transistor pair,
   wherein when the first node is coupled to a power, the second node is coupled to a ground, and when the first node is coupled to the ground, the second node is coupled to the power.

5. The analog-to-digital converter as claimed in claim 4, wherein a first comparator offset is obtained when the gates of the first differential input transistor pair are shorted together, the gates of the second differential input transistor pair are shorted together, and the pair of differential outputs are not swapped by the switch signal, and a second comparator offset is obtained when the gates of the second differential input transistor pair are shorted, the gates of the second differential input transistor pair are shorted, and the pair of differential outputs are swapped by the switch signal.

6. The analog-to-digital converter as claimed in claim 5, wherein the second calibration unit comprises:
   a first differential bias transistor pair, wherein each gate of the first differential bias transistor pair is capable for receiving a bias voltage; and
   a first digital-to-analog converting unit coupled to first differential bias transistor pair, for controlling currents flowing through the first differential bias transistor pair according to a first control signal,
   wherein the first control signal having a first digital value corresponding to the first comparator offset is obtained when the first and second comparing signals are transited,
   wherein the first control signal having a second digital value corresponding to the second comparator offset is obtained when the first and second comparing signals are transited,
   wherein the second offset voltage is calibrated according to the first digital value and the second digital value.

7. The analog-to-digital converter as claimed in claim 4, further comprising:
   a replica amplifier, providing a compensation current according to a fixed bias voltage between the pair of differential analog input signals at the specific temperature,
   wherein the first calibration unit calibrates the first offset voltage from the pre-amplifier at the pair of differential outputs at the specific temperature.

8. The analog-to-digital converter as claimed in claim 7, wherein the first calibration unit comprises:
   a second differential bias transistor pair, wherein each gate of the second differential bias transistor pair is capable for receiving a bias voltage; and
   a second digital-to-analog converting unit coupled to second differential bias transistor pair, for controlling currents flowing through the second differential bias transistor pair according to the compensation current from the replica amplifier and a second control signal,
   wherein a preamplifier offset is obtained when the gates of the first differential input transistor pair are shorted, the gates of the second differential input transistor pair are shorted, and the pair of differential outputs are not swapped,
   wherein the second control signal having a third digital value corresponding to the preamplifier offset is obtained when the first and second comparing signals are transited, wherein the first offset voltage is calibrated according to the third digital value.

9. A calibration method for calibrating offset of an analog-to-digital converter, wherein the analog-to-digital converter comprises at least one pre-amplifier and at least one dynamic comparator, wherein the pre-amplifier provides a pair of differential outputs according to a pair of differential analog input signals and a first reference voltage and a second reference voltage, and the dynamic comparator provides a first comparing signal and a second comparing signal according to the pair of differential outputs, the method comprising:
calibrating a first offset voltage from the pre-amplifier at the pair of differential outputs, by a first calibration unit of the pre-amplifier at a specific temperature; and
calibrating a second offset voltage from the dynamic comparator at the pair of differential outputs, by a second calibration unit of the pre-amplifier.

10. The calibration method as claimed in claim 9, wherein the first offset voltage is caused by a first threshold voltage mismatch of input differential pair transistors in the pre-amplifier, and the second offset voltage is caused by a second threshold voltage mismatch of input differential pair transistors in the dynamic comparator.

11. The calibration method as claimed in claim 9, further comprising:
swapping the pair of differential outputs according to a switch signal by a swapping unit coupled between the pre-amplifier and the dynamic comparator.

12. The calibration method as claimed in claim 11, wherein the pre-amplifier further comprises:
a first resistor coupled to a power;
a second resistor coupled to the power;
a first current source coupled to a ground;
a first transistor coupled between the first resistor and the first current source, having a gate for receiving one signal among the pair of differential analog input signals;
a second transistor coupled between the second resistor and the first current source, having a gate for receiving the first reference voltage;
a second current source coupled to the ground;
a third transistor coupled between the first resistor and the second current source, having a gate for receiving another signal among the pair of differential analog input signals; and
a fourth transistor coupled between the second resistor and the second current source, having a gate for receiving the second reference voltage,
wherein the first and second transistors form a first differential input transistor pair, and the third and fourth transistors form a second differential input transistor pair.

13. The calibration method as claimed in claim 12, further comprising:
shorting the gates of the first differential input transistor pair together, and shorting the gates of the second differential input transistor pair together, to obtain a first comparator offset when the pair of differential outputs are not swapped by the switch signal; and
shorting the gates of the second differential input transistor pair together, and shorting the gates of the second differential input transistor pair together, to obtain a second comparator offset when the pair of differential outputs are swapped by the switch signal.

14. The calibration method as claimed in claim 13, wherein the second calibration unit comprises:
a first differential bias transistor pair, wherein each gate of the first differential bias transistor pair is capable for receiving a bias voltage; and
a first digital-to-analog converting unit coupled to first differential bias transistor pair, for controlling currents flowing through the first differential bias transistor pair according to a first control signal,
wherein the first control signal having a first digital value corresponding to the first comparator offset is obtained when the first and second comparing signals are transited,
wherein the first control signal having a second digital value corresponding to the second comparator offset is obtained when the first and second comparing signals are transited,
wherein the second offset voltage is calibrated according to the first digital value and the second digital value.

15. The calibration method as claimed in claim 12, further comprising:
providing a compensation current according to a fixed bias voltage between the pair of differential analog input signals at the specific temperature, by a replica amplifier,
wherein the first calibration unit calibrates the first offset voltage from the pre-amplifier at the pair of differential outputs at the specific temperature.

16. The calibration method as claimed in claim 15, wherein the first calibration unit comprises:
a second differential bias transistor pair, wherein each gate of the second differential bias transistor pair is capable for receiving a bias voltage; and
a second digital-to-analog converting unit coupled to second differential bias transistor pair, for controlling currents flowing through the second differential bias transistor pair according to the compensation current from the replica amplifier and a second control signal,
wherein a preamplifier offset is obtained when the gates of the first differential input transistor pair are shorted, the gates of the second differential input transistor pair are shorted, and the pair of differential outputs are not swapped,
wherein the second control signal having a third digital value corresponding to the preamplifier offset is obtained when the first and second comparing signals are transited,
wherein the first offset voltage is calibrated according to the third digital value.

* * * * *